(12) United States Patent
Takahashi

(10) Patent No.: US 11,205,994 B2
(45) Date of Patent: Dec. 21, 2021

(54) SOLAR PHOTOVOLTAIC INSTALLATION

(71) Applicant: CHURAECONET LLC, Okinawa (JP)

(72) Inventor: Kazuhiro Takahashi, Okinawa (JP)

(73) Assignee: CHURAECONET LLC, Okinawa (JP)

( * ) Notice: Subject to any disclaimer, the term of this patent is extended or adjusted under 35 U.S.C. 154(b) by 278 days.

(21) Appl. No.: 16/612,366

(22) PCT Filed: Mar. 30, 2018

(86) PCT No.: PCT/JP2018/013825
§ 371 (c)(1),
(2) Date: Nov. 8, 2019

(87) PCT Pub. No.: WO2018/207495
PCT Pub. Date: Nov. 15, 2018

(65) Prior Publication Data
US 2020/0169218 A1    May 28, 2020

(30) Foreign Application Priority Data

May 9, 2017   (JP) .............................. JP2017-093148

(51) Int. Cl.
*H02S 40/38*       (2014.01)
*H02S 10/20*       (2014.01)
(Continued)

(52) U.S. Cl.
CPC ........ *H02S 40/38* (2014.12); *G01R 19/16566* (2013.01); *H01L 31/05* (2013.01);
(Continued)

(58) Field of Classification Search
CPC .......... H02S 10/00; H02S 10/20; H02S 40/36; H02S 40/38; H02J 7/00; H02J 7/35; H01L 31/05; G01R 19/16566; Y02E 70/30
(Continued)

(56) References Cited

U.S. PATENT DOCUMENTS 5,744,936 A * 4/1998 Kawakami ............ H02J 7/0026
                                                       320/120
5,869,949 A * 2/1999 Nishikawa .......... H02J 7/00047
                                                       320/101
(Continued)

FOREIGN PATENT DOCUMENTS

JP      2011-254696 A     12/2011
JP      2012-044733 A      3/2012
(Continued)

OTHER PUBLICATIONS

Office Action of corresponding Korean Patent Application No. 10-2018-7036879 dated Jun. 15, 2020 (5 sheets, 6 sheets translation, 11 sheets total).
(Continued)

*Primary Examiner* — Pedro J Cuevas
(74) *Attorney, Agent, or Firm* — Kratz, Quintos & Hanson, LLP

(57) ABSTRACT

The present invention provides a solar photovoltaic installation capable of storing power while supplying power during daytime when solar radiation conditions are excellent. The solar photovoltaic installation of the invention includes at least a first solar module string 11 and a second solar module string 12 as solar module strings 10, the solar photovoltaic installation further includes at least a first storage battery array 21 and a second storage battery array 22 as storage battery arrays 20, and while power storage capacity detection means 60 detects that the second storage battery array 22 is less than a predetermined capacity and voltage detection means 50 detects voltage of more than predetermined voltage, the control means 40 connects the first solar module string 11 to a power conditioner 30, and connects the second solar module string 12 to the second storage battery array 22.

8 Claims, 7 Drawing Sheets

(51) Int. Cl.
*H02S 40/36* (2014.01)
*G01R 19/165* (2006.01)
*H01L 31/05* (2014.01)
*H02S 10/00* (2014.01)
*H02J 7/00* (2006.01)
*H02J 7/35* (2006.01)

(52) U.S. Cl.
CPC ............... *H02J 7/00* (2013.01); *H02J 7/35* (2013.01); *H02S 10/00* (2013.01); *H02S 10/20* (2014.12); *H02S 40/36* (2014.12); *Y02E 70/30* (2013.01)

(58) Field of Classification Search
USPC ............... 320/101, 103, 109, 134; 361/93.1
See application file for complete search history.

(56) References Cited

U.S. PATENT DOCUMENTS

| | | | | |
|---|---|---|---|---|
| 6,194,793 B1* | 2/2001 | Fisher, Jr. | ............ | H02J 7/0068 307/66 |
| 6,462,507 B2* | 10/2002 | Fisher, Jr. | ............ | H02J 7/35 320/101 |
| 7,970,560 B2* | 6/2011 | Rocci | ............ | G01R 31/40 702/60 |
| 8,183,819 B2* | 5/2012 | Sugano | ............ | B60L 53/14 320/103 |
| 8,311,753 B2* | 11/2012 | Rocci | ............ | G01R 31/40 702/60 |
| 8,504,314 B2* | 8/2013 | Rocci | ............ | G01R 31/40 702/63 |
| 8,829,857 B2* | 9/2014 | Minamiura | ............ | H01M 10/486 320/136 |
| 9,203,247 B2* | 12/2015 | Nakashima | ............ | H02J 7/0019 |
| 9,555,715 B2* | 1/2017 | Sugano | ............ | B60L 50/52 |
| 9,947,972 B2* | 4/2018 | Ozawa | ............ | H01M 10/4207 |
| 10,295,608 B2* | 5/2019 | Rocci | ............ | H01M 10/486 |
| 10,756,548 B2* | 8/2020 | Syouda | ............ | H02J 7/0014 |
| 10,946,762 B2* | 3/2021 | Gupta | ............ | B60L 53/52 |
| 11,025,086 B2* | 6/2021 | Tabuchi | ............ | H02J 7/0013 |
| 2001/0043050 A1* | 11/2001 | Fisher, Jr. | ............ | H02J 7/35 320/101 |
| 2007/0210746 A1* | 9/2007 | Tanjou | ............ | H02J 7/0016 320/112 |
| 2008/0143292 A1* | 6/2008 | Ward | ............ | B60L 58/15 320/101 |
| 2008/0197808 A1* | 8/2008 | Banta | ............ | H02J 7/00 320/134 |
| 2010/0072946 A1* | 3/2010 | Sugano | ............ | B60L 53/51 320/108 |
| 2011/0006600 A1* | 1/2011 | Fontana | ............ | H02J 1/10 307/25 |
| 2011/0068746 A1* | 3/2011 | Rocci | ............ | H02J 13/00028 320/118 |
| 2011/0103114 A1* | 5/2011 | Huang | ............ | H01L 31/02021 363/131 |
| 2011/0199053 A1* | 8/2011 | Minamiura | ............ | H01M 10/482 320/136 |
| 2011/0279088 A1* | 11/2011 | Yamamoto | ............ | H01M 10/48 320/134 |
| 2011/0288798 A1* | 11/2011 | Rocci | ............ | G01R 31/40 702/63 |
| 2011/0291479 A1 | 12/2011 | Lee | | |
| 2011/0304304 A1* | 12/2011 | Ankyu | ............ | B60L 53/305 320/162 |
| 2012/0056594 A1* | 3/2012 | Yanagihara | ............ | H02J 7/0014 320/134 |
| 2013/0015819 A1* | 1/2013 | Nakashima | ............ | H02J 7/0019 320/126 |
| 2013/0049676 A1* | 2/2013 | Ishikawa | ............ | B60L 1/006 320/103 |
| 2013/0135110 A1* | 5/2013 | Xie | ............ | G08B 29/181 340/636.11 |
| 2013/0308239 A1* | 11/2013 | Yamada | ............ | H02J 7/0031 361/93.1 |
| 2014/0347017 A1* | 11/2014 | Sugano | ............ | B60L 50/60 320/137 |
| 2015/0069844 A1* | 3/2015 | Wu | ............ | H02J 3/32 307/74 |
| 2016/0121735 A1* | 5/2016 | Sugano | ............ | B60L 53/16 320/109 |
| 2017/0018932 A1* | 1/2017 | Pahlevaninezhad | .... | H02M 7/48 |
| 2017/0279279 A1* | 9/2017 | Shimada | ............ | H02J 3/381 |
| 2018/0076637 A1* | 3/2018 | Shiraki | ............ | H02J 7/0013 |
| 2019/0219639 A1* | 7/2019 | Kawabe | ............ | H02J 3/32 |
| 2020/0244096 A1* | 7/2020 | Tabuchi | ............ | H02M 3/3376 |
| 2021/0028625 A1* | 1/2021 | Inoue | ............ | H02S 40/32 |

FOREIGN PATENT DOCUMENTS

| | | |
|---|---|---|
| JP | 2014-099979 A | 5/2014 |
| JP | 2015-164378 A | 9/2015 |
| JP | 2015-211630 A | 11/2015 |
| JP | 5921786 B2 | 5/2016 |
| JP | 2016-149876 A | 8/2016 |
| JP | WO2015/198630 A1 | 4/2017 |

OTHER PUBLICATIONS

International Search Report for International Application No. PCT/JP2018/013825 dated May 22, 2018 (3 sheets, 2 sheets translation, 5 sheets total).

* cited by examiner

[Fig. 1]
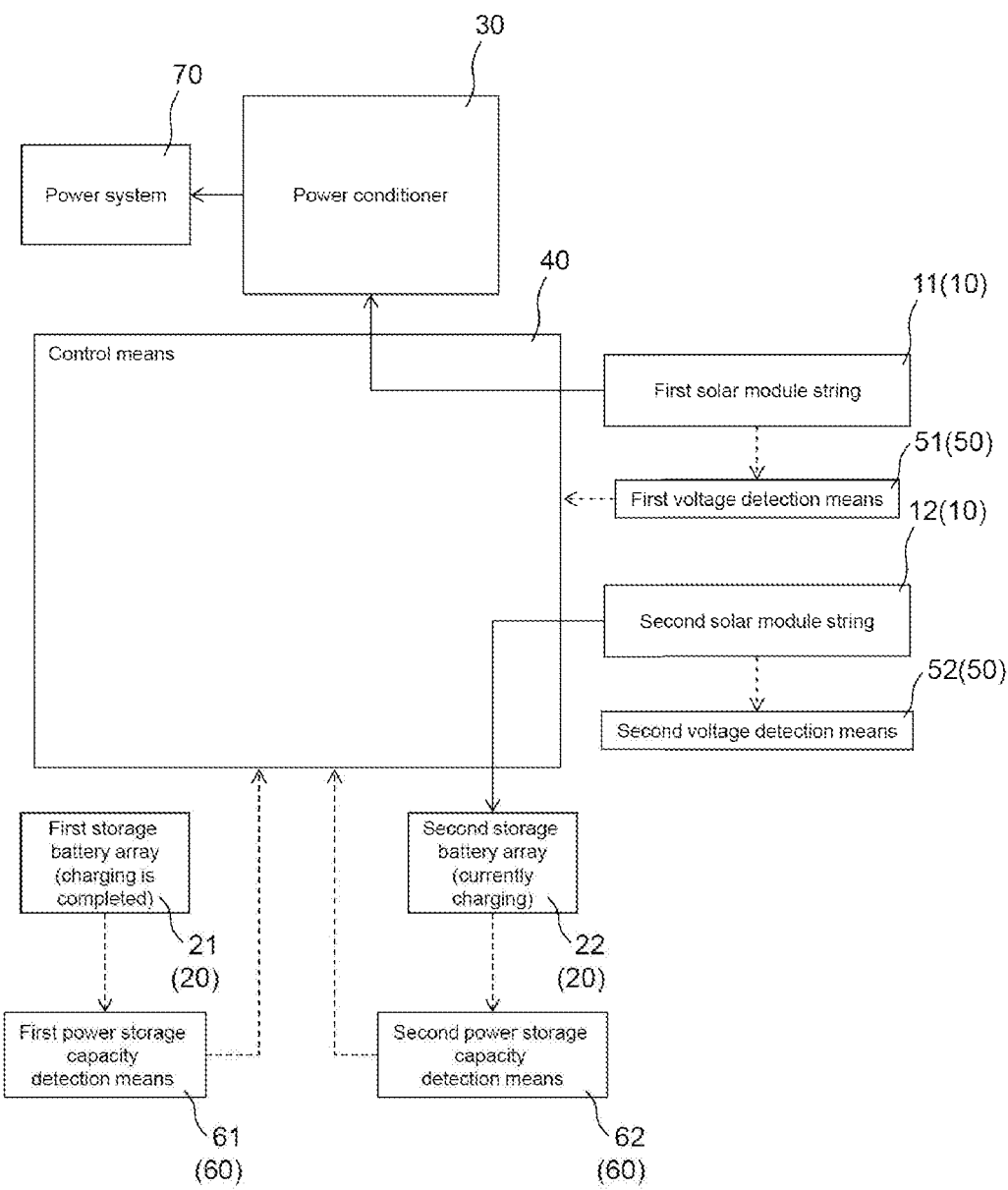

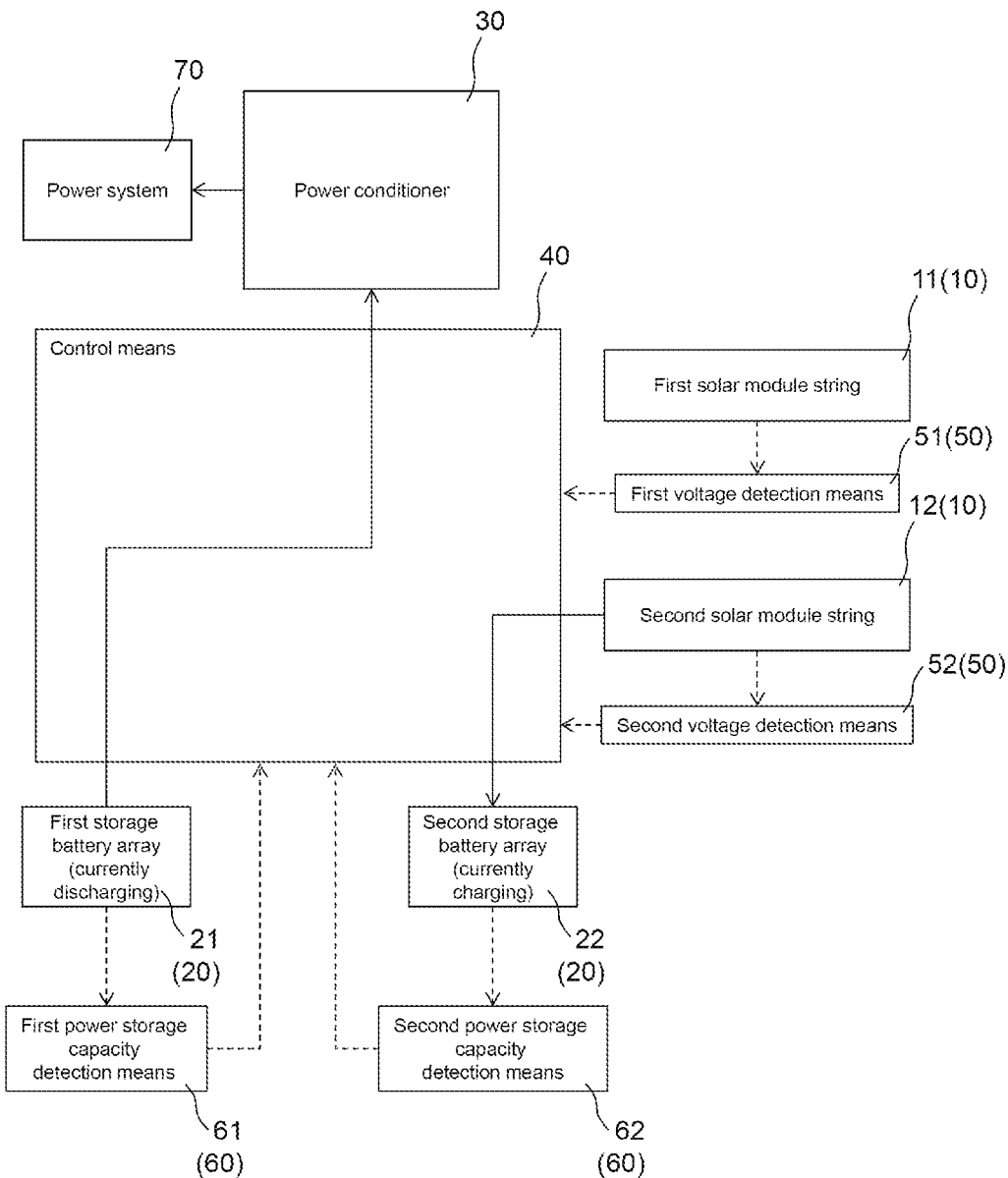
[Fig. 2]

[Fig. 3]
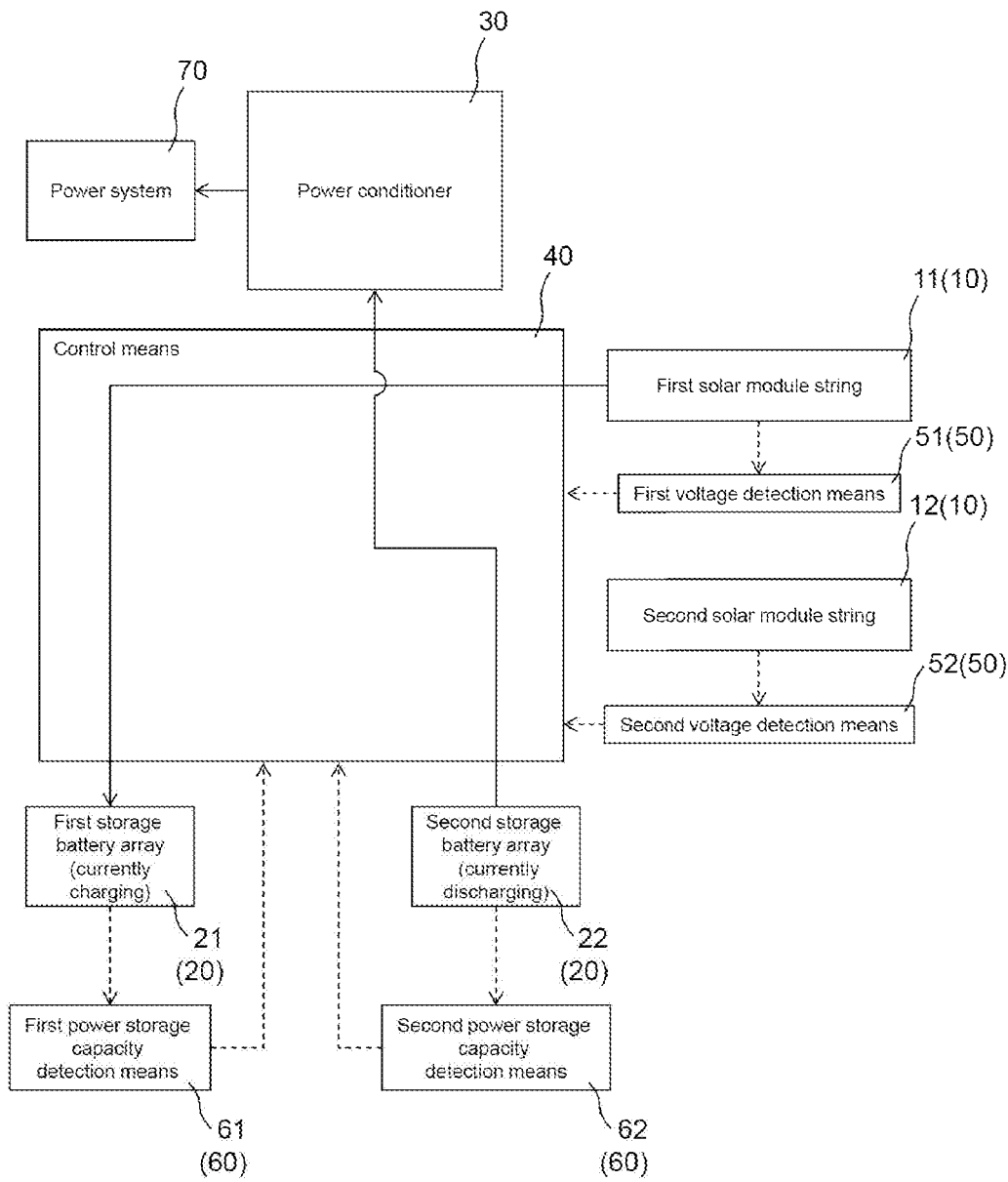

[Fig. 4]
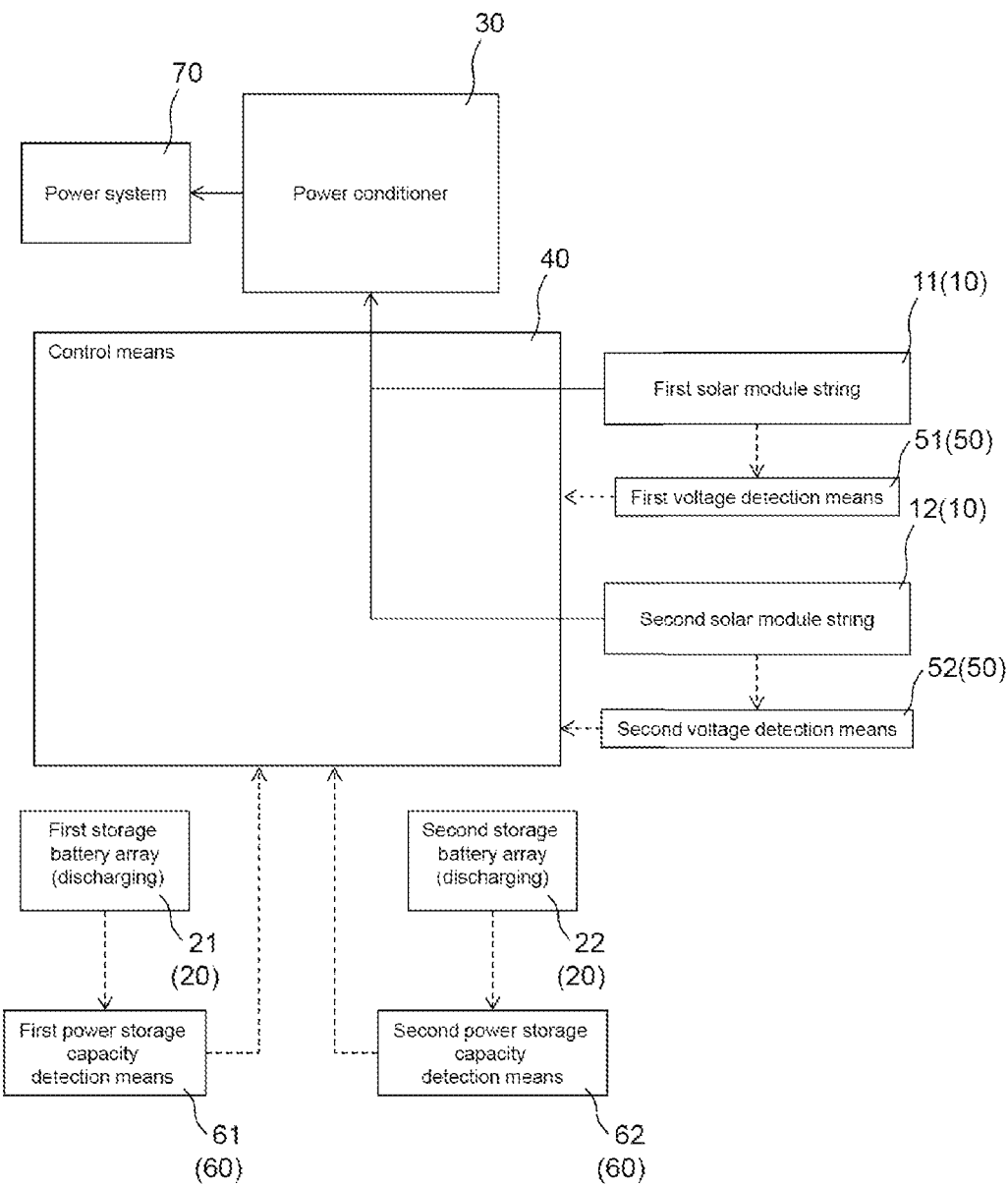

[Fig. 5]
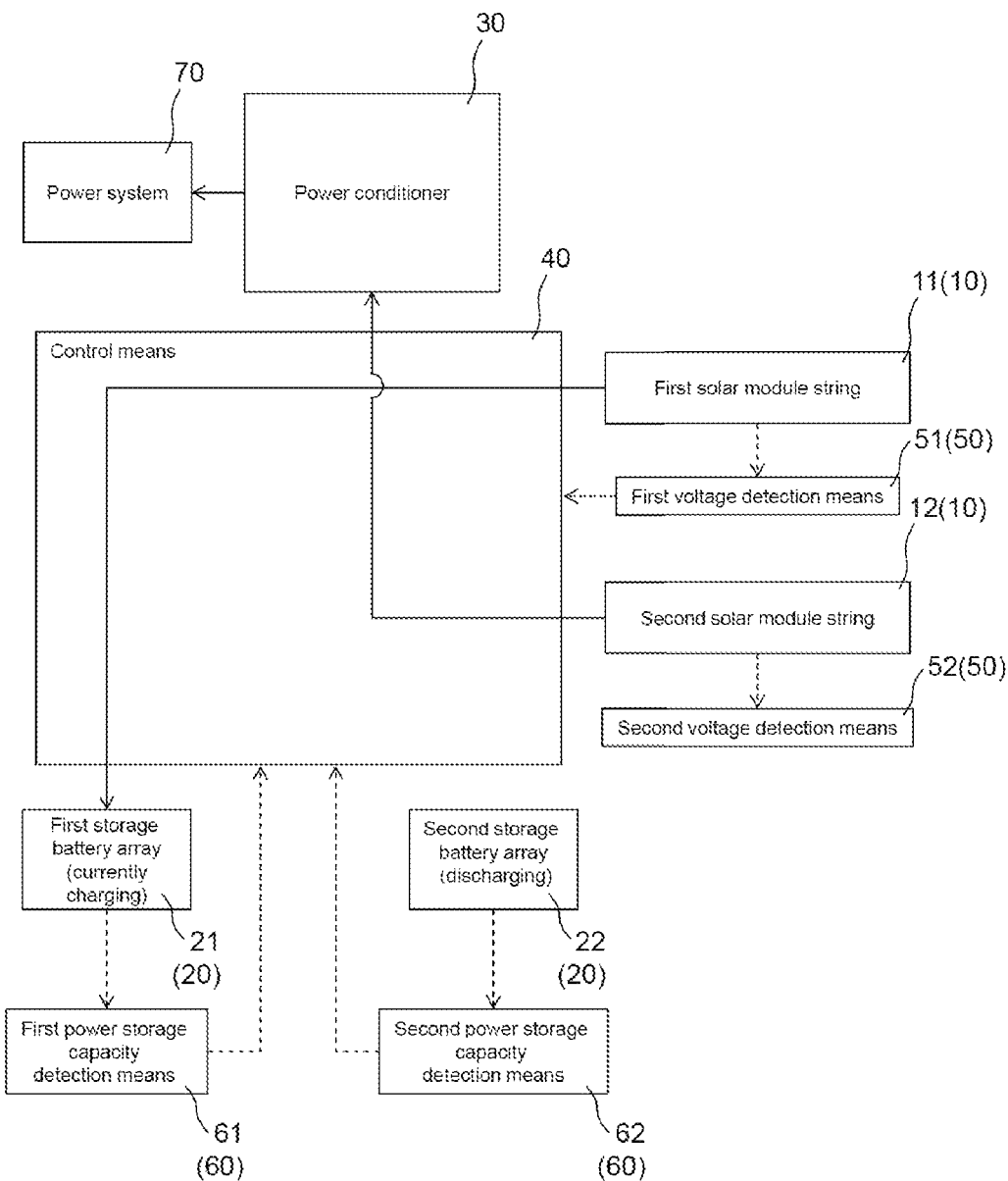

[Fig. 6]
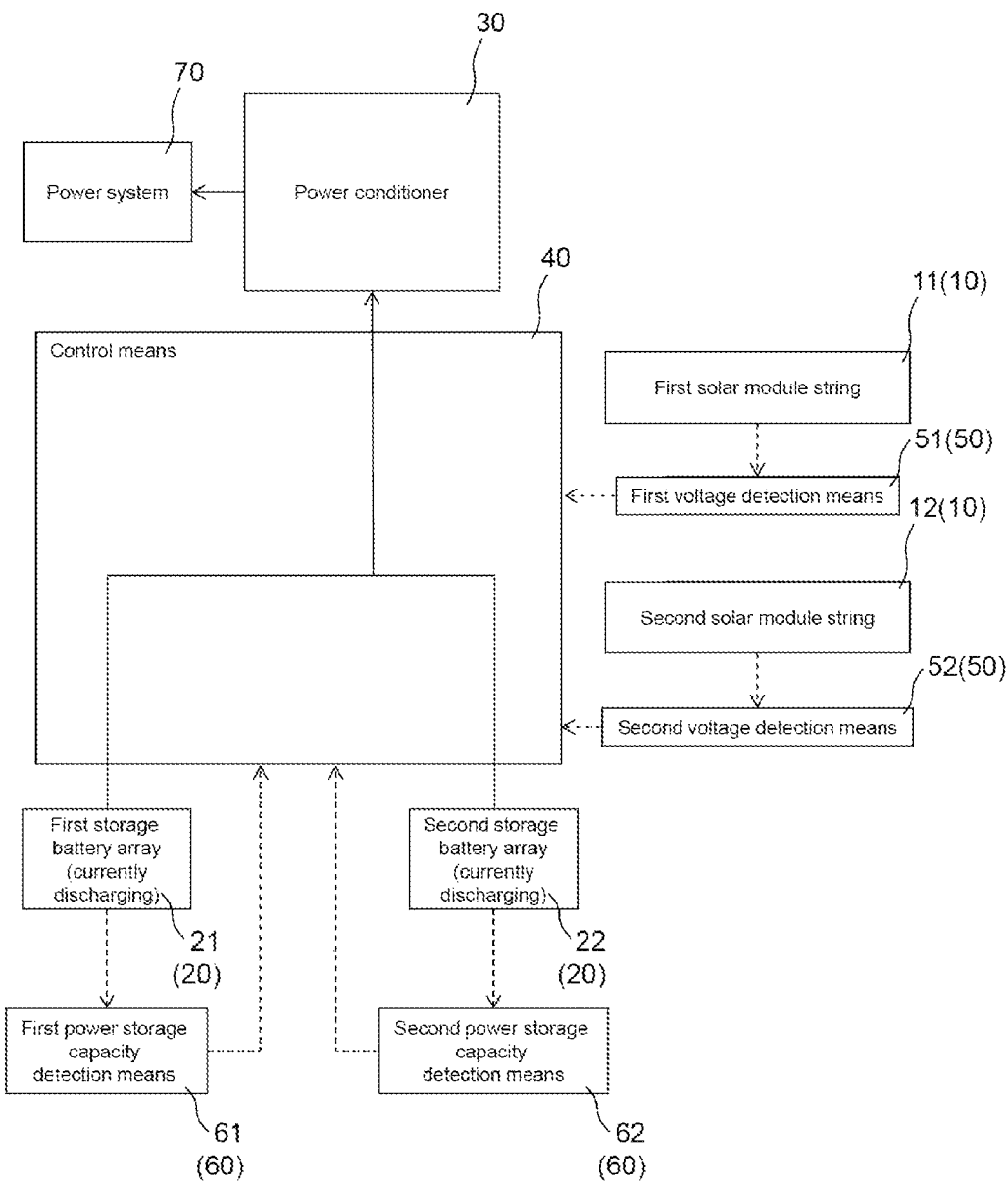

[Fig. 7]
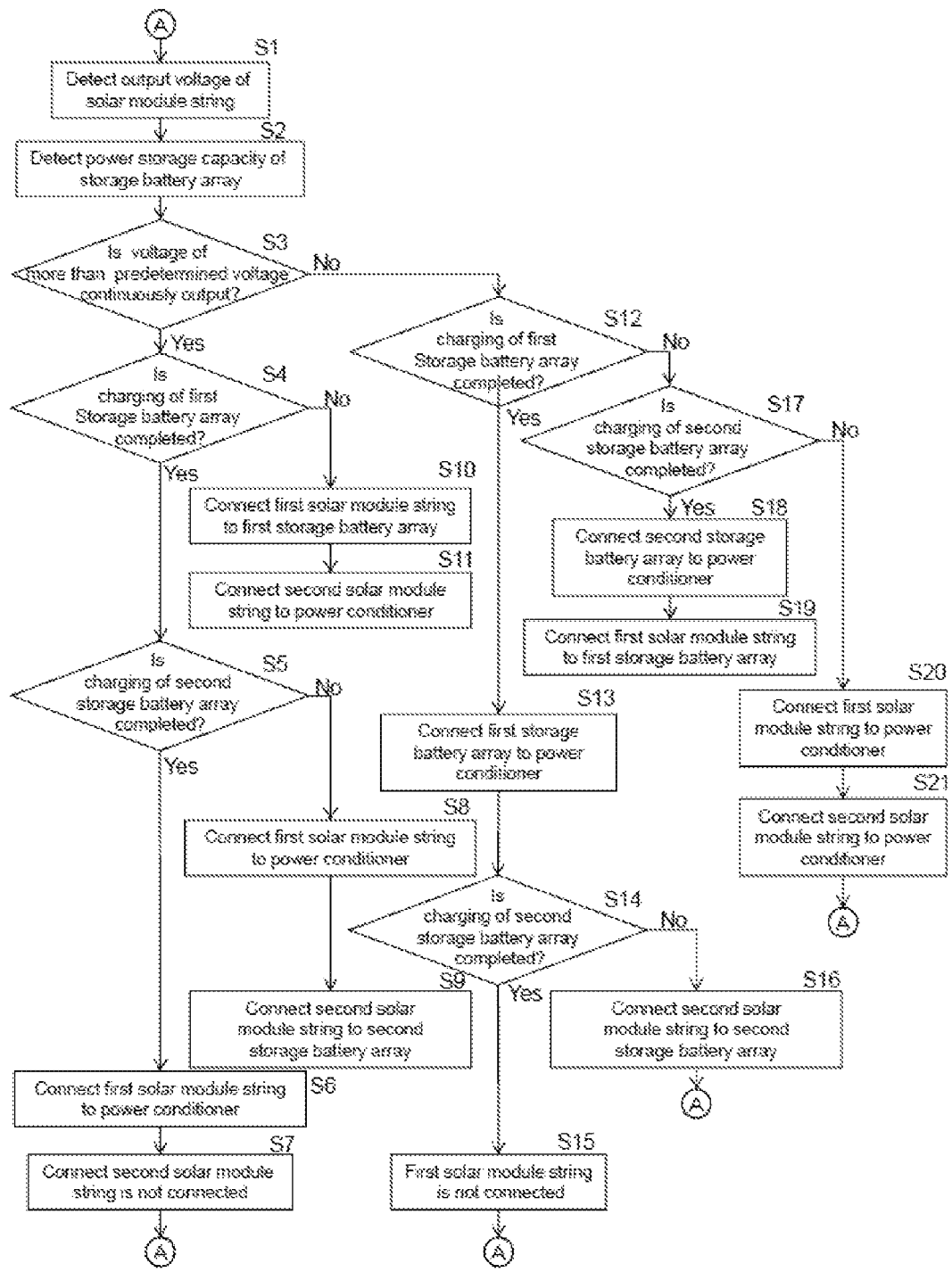

SOLAR PHOTOVOLTAIC INSTALLATION

TECHNICAL FIELD

The present invention relates to a solar photovoltaic installation capable of storing surplus power while supplying power by power generation during daytime.

BACKGROUND TECHNIQUE

Patent document 1 proposes a system interconnection power storage system for continuously supplying stabilized power to a power conditioner to which a storage battery, an automatic charge/discharge device and a voltage boosting and lowering circuit are mounted.

PRIOR ART DOCUMENT

Patent Document

[Patent Document 1] Japanese Patent Application Laid-open No. 2015-211630

SUMMARY OF THE INVENTION

Problem to be Solved by the Invention

According to patent document 1, it is possible to store surplus power while sending power generated by a solar panel to a system during daytime, and to supply power charged to a storage battery after sunset.

It is an object of the present invention to provide a solar photovoltaic installation capable of storing power while supplying power during daytime when solar radiation conditions are excellent.

Means for Solving the Problem

A first aspect of the present invention provides a solar photovoltaic installation including: solar module strings for carrying out solar photovoltaic generation; storage battery arrays for storing power supplied from the solar module strings; a power conditioner for supplying power from the solar module strings or the storage battery arrays to a power system; control means for switching connection from the solar module strings to the power conditioner or the storage battery arrays, and for switching connection from the storage battery arrays to the power conditioner; voltage detection means for detecting output voltage of the solar module strings; and power storage capacity detection means for detecting a power storage amount of the storage battery arrays; wherein the solar photovoltaic installation further includes at least a first solar module string and a second solar module string as the solar module strings, the solar photovoltaic installation further includes at least a first storage battery array and a second storage battery array as the storage battery arrays, and while the power storage capacity detection means detects that the second storage battery array is less than a predetermined capacity and the voltage detection means detects voltage of more than predetermined voltage, the control means connects the first solar module string to the power conditioner, and connects the second solar module string to the second storage battery array.

According to a second aspect of the invention, in the solar photovoltaic installation described in the first aspect, when the power storage capacity detection means detects that the first storage battery array is more than the predetermined capacity and the voltage detection means detects voltage of less than the predetermined voltage predetermined times within predetermined time, the control means cuts off the first solar module string from the power conditioner and connects the first storage battery array to the power conditioner.

According to a third aspect of the invention, in the solar photovoltaic installation described in the second aspect, when a state in which the voltage detection means detects the voltage of less than the predetermined voltage the predetermined times within the predetermined time is continued and the power storage capacity detection means detects that the first storage battery array is less than the predetermined capacity and that the second storage battery array is more than the predetermined capacity, the control means cuts off the second solar module string from the second storage battery array, cuts off the first storage battery array from the power conditioner, and connects the second storage battery array to the power conditioner.

According to a fourth aspect of the invention, in the solar photovoltaic installation described in the third aspect, when a state in which the voltage detection means detects the voltage of less than the predetermined voltage the predetermined times within the predetermined time is continued and the power storage capacity detection means detects that the first storage battery array is less than the predetermined capacity and the second storage battery array is more than the predetermined capacity, the control means connects the first solar module string to the first storage battery array.

According to a fifth aspect of the invention, in the solar photovoltaic installation described in the third or fourth aspect, when a state in which the voltage detection means detects the voltage of less than the predetermined voltage the predetermined times within the predetermined time is continued and the power storage capacity detection means detects that the first storage battery array and the second storage battery array are less than the predetermined capacity, the control means cuts off the second storage battery array from the power conditioner and connects the first solar module string and the second solar module string to the power conditioner.

According to a sixth aspect of the invention, in the solar photovoltaic installation described in the first aspect, while the power storage capacity detection means detects that the first storage battery array and the second storage battery array are less than the predetermined capacity and the voltage detection means detects the voltage of more than the predetermined voltage, the control means connects the first solar module string to the first storage battery array and connects the second solar module string to the power conditioner.

According to a seventh aspect of the invention, in the solar photovoltaic installation described in the sixth aspect, while the power storage capacity detection means detects that the first storage battery array is more than the predetermined capacity and that the second storage battery array is less than the predetermined capacity and the voltage detection means detects the voltage of more than the predetermined voltage, the control means connects the first solar module string to the power conditioner and connects the second solar module string to the second storage battery array.

According to a eighth aspect of the invention, in the solar photovoltaic installation described in any one of the first to seventh aspects, the solar photovoltaic installation further includes timer means for setting discharge start time at which the storage battery array is connected to the power conditioner, wherein at the discharge start time, when the power storage capacity detection means detects that the first storage battery array or the second storage battery array is more than the predetermined capacity, the control means connects the first storage battery array and the second storage battery array to the power conditioner.

Effect of the Invention

According to the solar photovoltaic installation of the present invention, while the power storage capacity detection means detects that the second storage battery array is less than predetermined capacity, and the voltage detection means detects voltage of not less than predetermined voltage, the first solar module string is connected to the power conditioner, the second solar module string is connected to the second storage battery array. According to this, it is possible to store power while supplying power during daytime when solar radiation conditions are excellent.

BRIEF DESCRIPTION OF THE DRAWINGS

FIG. 1 is a block diagram showing that a solar photovoltaic installation according to an embodiment of the present invention is expressed by function realizing means, and showing that solar radiation conditions in daytime are excellent;

FIG. 2 is a block diagram showing that in the state shown in FIG. 1, solar radiation variation during daytime becomes large, or solar radiation is poor;

FIG. 3 is a block diagram showing that the state shown in FIG. 2 is further continued and the first storage battery array is discharged;

FIG. 4 is a block diagram showing that the state shown in FIG. 3 is further continued and the first storage battery array and a second storage battery array are discharged;

FIG. 5 is a block diagram showing that in the state shown in FIG. 4, the solar radiation conditions are returned to the excellent state;

FIG. 6 is a block diagram showing power supply during night; and

FIG. 7 is a flowchart showing control of the solar photovoltaic installation according to the embodiment.

MODE FOR CARRYING OUT THE INVENTION

A solar photovoltaic installation according to a first aspect of the present invention, the solar photovoltaic installation further includes at least a first solar module string and a second solar module string as the solar module strings, the solar photovoltaic installation further includes at least a first storage battery array and a second storage battery array as the storage battery arrays, and while the power storage capacity detection means detects that the second storage battery array is less than a predetermined capacity and the voltage detection means detects voltage of more than predetermined voltage, the control means connects the first solar module string to the power conditioner, and connects the second solar module string to the second storage battery array. According to this aspect, it is possible to store power while supplying power during daytime when solar radiation conditions are excellent.

According to a second aspect of the invention, in the solar photovoltaic installation of the first aspect, when the power storage capacity detection means detects that the first storage battery array is more than the predetermined capacity and the voltage detection means detects voltage of less than the predetermined voltage predetermined times within predetermined time, the control means cuts off the first solar module string from the power conditioner and connects the first storage battery array to the power conditioner. According to this aspect, during daytime when solar radiation variation is large or solar radiation is poor, it is possible to supply stabilized power having no voltage fluctuation by supplying power utilizing the power storage.

According to a third aspect of the invention, in the solar photovoltaic installation of the second aspect, a state in which the voltage detection means detects the voltage of less than the predetermined voltage the predetermined times within the predetermined time is continued and the power storage capacity detection means detects that the first storage battery array is less than the predetermined capacity and that the second storage battery array is more than the predetermined capacity, the control means cuts off the second solar module string from the second storage battery array, cuts off the first storage battery array from the power conditioner, and connects the second storage battery array to the power conditioner. According to this aspect, even when solar radiation variation is continued for a long time, it is possible to supply stabilized power having no voltage fluctuation by supplying power while utilizing power storage.

According to a fourth aspect of the invention, in the solar photovoltaic installation of the third aspect, when a state in which the voltage detection means detects the voltage of less than the predetermined voltage the predetermined times within the predetermined time is continued and the power storage capacity detection means detects that the first storage battery array is less than the predetermined capacity and the second storage battery array is more than the predetermined capacity, the control means connects the first solar module string to the first storage battery array. According to this aspect, even during daytime when solar radiation variation is large, it is possible to effectively utilize the power generation by utilizing the same for power storage.

According to a fifth aspect of the invention, in the solar photovoltaic installation of the third or fourth aspect, when a state in which the voltage detection means detects the voltage of less than the predetermined voltage the predetermined times within the predetermined time is continued and the power storage capacity detection means detects that the first storage battery array and the second storage battery array are less than the predetermined capacity, the control means cuts off the second storage battery array from the power conditioner and connects the first solar module string and the second solar module string to the power conditioner. According to this aspect, even when solar radiation variation is continued for a long time and stabilized power cannot be supplied by power storage, the power supply can be continued by connecting the first solar module string and the second solar module string to the power conditioner.

According to a sixth aspect of the invention, in the solar photovoltaic installation of the first aspect, while the power storage capacity detection means detects that the first storage battery array and the second storage battery array are less than the predetermined capacity and the voltage detection means detects the voltage of more than the predetermined voltage, the control means connects the first solar module string to the first storage battery array and connects the second solar module string to the power conditioner. According to this aspect, it is possible to store power while supplying power during daytime when solar radiation conditions are excellent.

According to a seventh aspect of the invention, in the solar photovoltaic installation of the sixth aspect, while the power storage capacity detection means detects that the first storage battery array is more than the predetermined capacity and that the second storage battery array is less than the predetermined capacity and the voltage detection means detects the voltage of more than the predetermined voltage, the control means connects the first solar module string to the power conditioner and connects the second solar module string to the second storage battery array. According to this aspect, it is possible to store power while supplying power during daytime when solar radiation conditions are excellent.

According to an eighth aspect of the invention, in the solar photovoltaic installation of any one of the first to seventh aspects, solar photovoltaic installation further includes timer means for setting discharge start time at which the storage battery array is connected to the power conditioner, wherein at the discharge start time, when the power storage capacity detection means detects that the first storage battery array or the second storage battery array is more than the predetermined capacity, the control means connects the first storage battery array and the second storage battery array to the power conditioner. According to this aspect, it is possible to supply power which is stored by designating night time zone by the timer when power cannot be generated.

Embodiment

A solar photovoltaic installation according to an embodiment of the present invention will be described below.

FIGS. 1 to 6 are block diagrams showing that the solar photovoltaic installation according to the embodiment of the invention is expressed by function realizing means.

FIG. 1 is the block diagram showing that solar radiation conditions during daytime are excellent.

The solar photovoltaic installation according to the embodiment includes solar module strings 10 which carry out solar photovoltaic generation, storage battery arrays 20 for storing power supplied from the solar module strings 10, a power conditioner 30 for supplying power from the solar module strings 10 or the storage battery arrays 20 to a power system 70, and control means 40 for switching connection from the solar module strings 10 to the power conditioner 30 or the storage battery array 20 and for switching connection from the storage battery array 20 to the power conditioner 30.

The solar photovoltaic installation according to the embodiment further includes voltage detection means 50 for detecting output voltage of the solar module strings 10, and power storage capacity detection means 60 for detecting power storage capacities of the storage battery arrays 20.

Power which is converted by the power conditioner 30 is supplied to the power system 70.

The solar photovoltaic installation according to the embodiment further includes at least a first solar module string 11 and a second solar module string 12 as the solar module strings 10, and includes at least a first storage battery array 21 and a second storage battery array 22 as the storage battery arrays 20.

The first voltage detection means 51 detects output voltage of the first solar module string 11, and the second voltage detection means 52 detects output voltage of the second solar module string 12.

First power storage capacity detection means 61 detects power storage capacity of the first storage battery array 21, and second power storage capacity detection means 62 detects power storage capacity of the second storage battery array 22.

As shown in FIG. 1, in a state in which solar radiation conditions during daytime are excellent, while the second power storage capacity detection means 62 detects that the second storage battery array 22 is smaller than a predetermined capacity and the first voltage detection means 51 detects that the first solar module string 11 has voltage of more than predetermined voltage, the control means 40 connects the first solar module string 11 to the power conditioner 30, and connects the second solar module string 12 to the second storage battery array 22.

Therefore, it is possible to store power while supplying power during daytime when the solar radiation conditions are excellent.

FIG. 2 is the block diagram showing solar radiation variation during daytime becomes large or solar radiation is poor in the state shown in FIG. 1. Here, the fact that the solar radiation variation becomes large means a case where the weather is clear up but a cloudy or rainy state is continuously generated, and the fact that solar radiation is poor means a continuous cloudy or rainy state.

In a state in which solar radiation variation during daytime is large or a state in which the solar radiation is poor as shown in FIG. 2, when the first power storage capacity detection means 61 detects that the first storage battery array 21 is more than the predetermined capacity, and the first voltage detection means 51 detects voltage of less than the predetermined voltage predetermined times within predetermined time, the control means 40 cuts off the first solar module string 11 from the power conditioner 30, and connects the first storage battery array 21 to the power conditioner 30.

Therefore, during daytime when the solar radiation variation is large or the solar radiation is poor, if power is supplied while utilizing power storage, it is possible to supply stabilized power having no voltage fluctuation.

FIG. 3 is the block diagram showing a state in which the state shown in FIG. 2 is continued, and the first storage battery array is adversely discharged.

When the state in which the solar radiation variation during daytime is large or the solar radiation is poor is continued, the state in which the first storage battery array 21 is adversely discharged, i.e., the state in which the first voltage detection means 51 detects voltage of less than predetermined voltage predetermined times within predetermined time is continued and the first power storage capacity detection means 61 detects that the first storage battery array 21 is less than the predetermined capacity and the second power storage capacity detection means 62 detects that the second storage battery array 22 is more than the predetermined capacity, the control means 40 cuts off the second solar module string 12 from the second storage battery array 22, cuts off the first storage battery array 21 from the power conditioner 30 and connects the second storage battery array 22 to the power conditioner 30 as shown in FIG. 3.

Therefore, even when the solar radiation variation is continued for a long time, it is possible to supply stabilized power having no voltage fluctuation by supplying power while utilizing power storage.

When the first power storage capacity detection means 61 detects that the first storage battery array 21 is less than the predetermined capacity and the second power storage capacity detection means 62 detects that the second storage battery array 22 is more than the predetermined capacity, the control means 40 connects the first solar module string 11 to the first storage battery array 21 as shown in FIG. 3.

Therefore, even during daytime when the solar radiation variation is large, it is possible to effectively utilize power generation by utilizing power storage.

FIG. 4 is the block diagram showing a state in which the state shown in FIG. 3 is continued, and the first storage battery array and the second storage battery array are adversely discharged.

When a state in which the first storage battery array 21 and the second storage battery array 22 are discharged because a state in which the solar radiation variation during daytime is large or the solar radiation is poor is continued, i.e., a state in which the first voltage detection means 51 or the second voltage detection means 52 detects that voltage of less than predetermined voltage is detected predetermined times within predetermined time is continued and the first power storage capacity detection means 61 and the second power storage capacity detection means 62 detect that the first storage battery array 21 and the second storage battery array 22 are less than the predetermined capacity, the control means 40 cuts off the second storage battery array 22 from the power conditioner 30 and connects the first solar module string 11 and the second solar module string 12 to the power conditioner 30 as shown in FIG. 4.

Therefore, even when the solar radiation variation is continued for a long time and stabilized power by the power storage cannot be supplied, it is possible to continue the power supply by connecting the first solar module string 11 and the second solar module string 12 to the power conditioner 30.

FIG. 5 is the block diagram showing that in the state shown in FIG. 4, the solar radiation conditions are returned to the excellent state.

While the first power storage capacity detection means 61 and the second power storage capacity detection means 62 detect that the first storage battery array 21 and the second storage battery array 22 are less than the predetermined capacity and the first voltage detection means 51 or the second voltage detection means 52 detects voltage of more than the predetermined voltage, the control means 40 connects the first solar module string 11 to the first storage battery array 21 and connects the second solar module string 12 to the power conditioner 30.

Therefore, it is possible to store power while supplying power during daytime where the solar radiation conditions are excellent.

In the state shown in FIG. 5, when a state when the solar radiation conditions are excellent is continued and charging of the first storage battery array 21 is completed, the state becomes that shown in FIG. 1.

That is, while the first power storage capacity detection means 61 detects that the first storage battery array 21 is more than the predetermined capacity and the second power storage capacity detection means 62 detects that the second storage battery array 22 is less than the predetermined capacity and the first voltage detection means 51 or the second voltage detection means 52 detects voltage of more than predetermined voltage, the control means 40 connects the first solar module string 11 to the power conditioner 30 and connects the second solar module string 12 to the second storage battery array 22.

Therefore, it is possible to store power while supplying power during daytime when the solar radiation conditions are excellent.

FIG. 6 is the block diagram showing power supply during night.

The control means 40 includes timer means 41 which sets the discharge start time at which the first storage battery array 21 or the second storage battery array 22 is connected to the power conditioner 30.

At the discharge start time which is set by the timer means 41, when the first power storage capacity detection means 61 or the second power storage capacity detection means 62 detects that the first storage battery array 21 or the second storage battery array 22 is more than the predetermined capacity, the control means 40 connects the first storage battery array 21 and the second storage battery array 22 to the power conditioner 30.

Therefore, it is possible to supply power which is stored by designating night time zone by the timer when power cannot be generated.

FIG. 7 is a flowchart showing control of the solar photovoltaic installation according to the embodiment.

The solar photovoltaic installation according to the embodiment detects output voltage of the first solar module string 11 or the second solar module string 12 by the first voltage detection means 51 or the second voltage detection means 52 (S1).

The solar photovoltaic installation according to the embodiment detects power storage capacities of the first storage battery array 21 and the second storage battery array 22 by the first power storage capacity detection means 61 and the second power storage capacity detection means 62 (S2).

In S3, if it is determined that the first solar module string 11 or the second solar module string 12 continuously outputs predetermined voltage for predetermined time and it is determined that the charging of the first storage battery array 21 is completed (S4) and the charging of the second storage battery array 22 is completed (S5), the first solar module string 11 is connected to the power conditioner 30 (S6). In this case, the second solar module string 12 is brought into a not-connected state (S7).

In S5, if it is determined that the charging of the second storage battery array 22 is not completed, the first solar module string 11 is connected to the power conditioner 30 (S8), and the second solar module string 12 is connected to the second storage battery array 22 (S9).

In S4, if it is determined that the charging of the first storage battery array 21 is not completed, the first solar module string 11 is connected to the first storage battery array 21 (S10), and the second solar module string 12 is connected to the power conditioner 30 (S11).

If it is determined in S3 that the first solar module string 11 or the second solar module string 12 does not continuously output predetermined voltage for the predetermined time and it is determined in S12 that the charging of the first storage battery array 21 is completed, the first storage battery array 21 is connected to the power conditioner 30 (S13).

If it is determined in S12 that the charging of the first storage battery array 21 is completed and if it is determined in S14 that the charging of the second storage battery array 22 is completed, the first solar module string 11 is brought into a not-connected state (S15).

If it is determined in S12 that the charging of the first storage battery array 21 is completed and if it is determined in S14 that the charging of the second storage battery array 22 is not completed, the second solar module string 12 is connected to the second storage battery array 22 (516).

If it is determined in S12 that the charging of the first storage battery array 21 is not completed and if it is determined in S17 that the charging of the second storage battery array 22 is completed, the second storage battery array 22 is connected to the power conditioner 30 (S18), and the first solar module string 11 is connected to the first storage battery array 21 (519).

If it is determined in S12 that the charging of the first storage battery array 21 is not completed and if it is determined in S17 that the charging of the second storage battery array 22 is not completed, the first solar module string 11 is connected to the power conditioner 30 (S20), and the second solar module string 12 is connected to the power conditioner 30 (S21).

The maximum outputs of the first solar module string 11 and the second solar module string 12 are 20% or more and 5% or less of the maximum rated output of the power conditioner 30.

Although this embodiment has been described based on the case where the solar photovoltaic installation includes the first voltage detection means 51 and the second voltage detection means 52 as the first voltage detection means 50, one voltage detection means 50 may detect output voltage of any of the solar module strings 10.

Although the power storage capacity detection means 60 includes the first power storage capacity detection means 61 and the second power storage capacity detection means 62, one power storage capacity detection means 60 may detect power storage amounts of the first storage battery array 21 and the second storage battery array 22.

The solar photovoltaic installation of the present invention can utilize the already-existing solar photovoltaic installation including the first solar module string 11, and the solar photovoltaic installation of the invention can be realized by adding the second solar module string 12, the first storage battery array 21 and the second storage battery array 22 and by exchanging the power conditioner 30.

INDUSTRIAL APPLICABILITY

According to the present invention, it is possible to equilibrate power supply during daytime, to sell power of surplus power, and to recover cost of introduction of storage battery.

EXPLANATION OF SYMBOLS 10 solar module string
11 first solar module string
12 second solar module string
storage battery array
21 first storage battery array
22 second storage battery array
30 power conditioner
40 control means
41 timer means
50 voltage detection means
51 first voltage detection means
52 second voltage detection means
60 power storage capacity detection means
61 first power storage capacity detection means
62 second power storage capacity detection means
70 power system

The invention claimed is:

1. A solar photovoltaic installation comprising:
   solar module strings for carrying out solar photovoltaic generation;
   storage battery arrays for storing power supplied from the solar module strings;
   a power conditioner for supplying power from the solar module strings or the storage battery arrays to a power system;
   control means for switching connection from the solar module strings to the power conditioner or the storage battery arrays, and for switching connection from the storage battery arrays to the power conditioner;
   voltage detection means for detecting output voltage of the solar module strings; and
   power storage capacity detection means for detecting a power storage amount of the storage battery arrays; wherein
   the solar photovoltaic installation further includes at least a first solar module string and a second solar module string as the solar module strings,
   the solar photovoltaic installation further includes at least a first storage battery array and a second storage battery array as the storage battery arrays, and
   while the power storage capacity detection means detects that the second storage battery array is less than a predetermined capacity and the voltage detection means detects voltage of more than predetermined voltage, the control means connects the first solar module string to the power conditioner, and connects the second solar module string to the second storage battery array.

2. The solar photovoltaic installation according to claim 1, wherein
   when the power storage capacity detection means detects that the first storage battery array is more than the predetermined capacity and the voltage detection means detects voltage of less than the predetermined voltage predetermined times within predetermined time, the control means cuts off the first solar module string from the power conditioner and connects the first storage battery array to the power conditioner.

3. The solar photovoltaic installation according to claim 2, wherein
   when a state in which the voltage detection means detects the voltage of less than the predetermined voltage the predetermined times within the predetermined time is continued and the power storage capacity detection means detects that the first storage battery array is less than the predetermined capacity and that the second storage battery array is more than the predetermined capacity, the control means cuts off the second solar module string from the second storage battery array, cuts off the first storage battery array from the power conditioner, and connects the second storage battery array to the power conditioner.

4. The solar photovoltaic installation according to claim 3, wherein
   when a state in which the voltage detection means detects the voltage of less than the predetermined voltage the predetermined times within the predetermined time is continued and the power storage capacity detection means detects that the first storage battery array is less than the predetermined capacity and the second storage battery array is more than the predetermined capacity, the control means connects the first solar module string to the first storage battery array.

5. The solar photovoltaic installation according to claim 3, wherein
   when a state in which the voltage detection means detects the voltage of less than the predetermined voltage the predetermined times within the predetermined time is continued and the power storage capacity detection means detects that the first storage battery array and the second storage battery array are less than the predetermined capacity, the control means cuts off the second storage battery array from the power conditioner and connects the first solar module string and the second solar module string to the power conditioner.

6. The solar photovoltaic installation according to claim 1, wherein while the power storage capacity detection means detects that the first storage battery array and the second storage battery array are less than the predetermined capacity and the voltage detection means detects the voltage of more than the predetermined voltage, the control means connects the first solar module string to the first storage battery array and connects the second solar module string to the power conditioner.

7. The solar photovoltaic installation according to claim 6, wherein while the power storage capacity detection means detects that the first storage battery array is more than the predetermined capacity and that the second storage battery array is less than the predetermined capacity and the voltage detection means detects the voltage of more than the predetermined voltage, the control means connects the first solar module string to the power conditioner and connects the second solar module string to the second storage battery array.

8. The solar photovoltaic installation according to claim 1, further comprising timer means for setting discharge start time at which the storage battery array is connected to the power conditioner, wherein at the discharge start time, when the power storage capacity detection means detects that the first storage battery array or the second storage battery array is more than the predetermined capacity, the control means connects the first storage battery array and the second storage battery array to the power conditioner.

* * * * *